United States Patent [19]
Bergemont

[11] Patent Number: 6,083,791
[45] Date of Patent: Jul. 4, 2000

[54] SELF-ALIGNED STACKED GATE ETCH PROCESS FOR FABRICATING A TWO-TRANSISTOR EEPROM CELL

[75] Inventor: Albert Bergemont, Palo Alto, Calif.

[73] Assignee: National Semiconductor Corporation, Santa Clara, Calif.

[21] Appl. No.: 08/990,493

[22] Filed: Dec. 15, 1997

[51] Int. Cl.[7] .................................................. H01L 21/336
[52] U.S. Cl. ......................... 438/258; 438/257; 438/241
[58] Field of Search .................................... 438/257, 258, 438/241; 257/316

[56] References Cited

U.S. PATENT DOCUMENTS 5,240,870  8/1993  Bergemont .
5,371,030  12/1994  Bergemont .

OTHER PUBLICATIONS

Wolf, Silicon Processing for the VLSI Era, vol. 2: Process Integration, pp. 628–635, 1990.

*Primary Examiner*—John F. Niebling
*Assistant Examiner*—John Murphy
*Attorney, Agent, or Firm*—Limbach & Limbach L.L.P.

[57] ABSTRACT

A process for fabricating a two-transistor EEPROM cell that includes a self-aligned stack gate etch step. In the self-aligned stack gate etch step, poly 2 word lines are used as a self-aligned mask to define edges of a poly 1 floating gate that are parallel to the edges of the poly 2 word line, and a patterned photoresist layer is used to define poly 1 access transistor lines. The process provides for employing a self-aligned stacked gate etch without risk of silicon substrate trenching. The process also provides for the fabrication of two-transistor EEPROM cell arrays of high packing density since the need for misalignment driven poly 2 overlap of poly 1 is eliminated.

6 Claims, 13 Drawing Sheets

6,083,791

SELF-ALIGNED STACKED GATE ETCH PROCESS FOR FABRICATING A TWO-TRANSISTOR EEPROM CELL

BACKGROUND OF THE INVENTION

1. Field of the Invention

The present invention relates to methods for the production of two-transistor electrically erasable programmable read only memory (EEPROM) cells and, in particular, to a method of fabricating such a cell utilizing a self-aligned stacked gate etch.

2. Description of the Related Art

An electrically programmable read only memory (EPROM) device is a non-volatile memory integrated circuit which is used to store binary data. Power can be removed from an EPROM without loss of data. That is, upon reapplying power, the originally stored binary data is retained.

In addition to its data retention capability, an EPROM can also be programmed to store new binary data. Reprogramming is accomplished by first exposing the EPROM to an ultraviolet (UV) light source in order to erase the old binary data. A UV-transparent lid on the packaged EPROM chip allows this erasure to occur. Following erasure, the new binary data is written into the EPROM by deactivating the chip select line in order to switch the EPROM's data outputs to inputs. The EPROM address inputs are then set to a starting value, the desired data is connected to the data inputs and the data is written into the data storage register identified by the address inputs. The address inputs are then incremented and the cycle is repeated for each storage register in the EPROM array.

In an EPROM read operation, the binary data stored in the data storage register identified at the address inputs is connected to the chip's data output buffers. If the EPROM's chip select signal is activated, then the binary data from the selected storage register is provided to the databus.

An electrically erasable programmable read only memory (EEPROM) device is a variation of the EPROM design wherein binary data is read, written and erased electrically. A single operation erases a selected data storage register.

A conventional two-transistor EEPROM device 10 is illustrated schematically by its circuit equivalent in FIG. 1. Access transistor 12 is used for cell selection and a non-volatile memory (NVM) storage transistor 14, which includes a word line control gate 16 and a floating gate 18, is used for charge storage.

FIGS. 2 and 3 illustrate a conventional two-transistor EEPROM device 10 in layout and cross-sectional views respectively. The device includes an access transistor gate 20 that is insulated from underlying P-type silicon substrate 22 by insulating layer 24 (typically silicon dioxide). The device also includes a floating gate 26, which is insulated and separated from silicon substrate 22 by insulating layer 24. A portion of floating gate 26 is separated from silicon substrate 22 by a relatively thin portion of insulating material 28. This relatively thin portion of insulating material, when made of silicon dioxide, is commonly known as "tunnel" oxide. A word line control gate 30 overlaps floating gate 26, but is separated from floating gate 26 by interpoly insulator 32 (typically an oxide-nitride-oxide (ONO) composite layer). Device 10 also includes a buried N+ region 34 underneath tunnel oxide 28, as well as N+ source region 36, combined N+ source/drain region 38 and graded N-type drain 40. A contact 42 is made to graded N-type drain 40.

In conventional processes used for fabricating the two-transistor EEPROM cell of FIGS. 2 and 3, the floating gate 26 is patterned from the first polysilicon (poly 1) layer deposited, while the word line control gate 30 and access transistor gate 20 are patterned from the second polysilicon (poly 2) layer deposited. Furthermore, in a conventional two-transistor EEPROM, the poly 2 word line control gate is formed such that it overlaps the poly 1 floating gate by an amount which insures a good coupling factor between the poly 2 word line control gate and the poly 1 floating gate. This overlap is illustrated by dimension L in FIGS. 2 and 3. To compensate for potential misalignment between the poly 2 word line control gate and the poly 1 floating gate, the cell size must be increased in the horizontal direction of FIG. 3. This approach, however, has the drawback of producing relatively large cell areas and relatively low cell packing density.

The drawbacks created by potential misalignment between the poly 2 word line control gate and the poly 1 floating gate can be solved by taking advantage of the fact that two of the poly 1 floating gate edges are parallel to the poly 2 word line control gate edges. The solution would employ a self-aligned stacked gate etch process to define these edges. The resultant structure, upon employment of a self-aligned stacked gate etch in conventional processes, is illustrated in FIG. 4. In FIG. 4, the edges of the poly 1 floating gate 42, that are parallel to the poly 2 word line control gate 40, are self-aligned to the edges of the poly 2 word line control gate 40. Interpoly insulator 44 separates poly 2 word line control gate 40 from poly 1 floating gate 42. Poly 2 access transistor gate 46 is insulated from silicon substrate 48 by insulating layer 50. Since poly 1 floating gate 42 is self-aligned to poly 2 word line control gate 42, there is no overlap L as in the conventional structure of FIGS. 2 and 3.

Self-aligned stacked gate etches have been described in U.S. Pat. Nos. 5,240,870 and 5,371,030 to Bergemont, both of which are hereby fully incorporated by reference. The methods described in these patents are useful, but require additional processing steps, including a differential oxidation, to avoid trenching of exposed silicon substrate regions during the self-aligned stacked gate etch step. The areas on either side of an access transistor 52 and an NVM storage transistor 54 would be subject to undesirable trenching in a conventional self-aligned stacked gate etch, as illustrated in FIG. 5.

Still needed in the art is a process of fabricating a two-transistor EEPROM cell with a self-aligned NVM storage transistor that eliminates the risk of trenching in the regions between the access transistor and the NVM storage transistor and that provides for increased cell densities.

SUMMARY OF THE INVENTION

The present invention provides a process of fabricating a two-transistor EEPROM cell in a silicon substrate. The cell produced by the process includes an NVM storage transistor where those poly 1 floating gate edges that are parallel to the poly 2 word line are aligned with the edges of the poly 2 word line control gate.

The process includes a step of forming spaced-apart field oxide (FOX) regions in the silicon substrate of a certain conductivity type (typically p-type). Next an insulating layer (typically silicon dioxide) is formed on the silicon substrate in areas between the FOX regions. Then a layer of first polysilicon (poly 1) is formed on the insulating layer and FOX regions. Openings are made in the poly 1 via masking with a first layer of photoresist (PR1) and patterning. These openings expose portions of the underlying insulating layer and FOX regions, and define poly 1 edges. Portions of these poly 1 edges are precursors to edges of a poly 1 floating gate that will, upon completion of the process, be perpendicular to edges of a poly 2 word line.

Following the formation of the openings in the poly 1, a layer of interpoly insulator (typically ONO) is formed blanketing poly 1 as well as the portions of the FOX regions and insulating layer that are exposed through the openings in the poly 1.

A layer of second polysilicon (poly 2) is subsequently deposited over the interpoly insulator, masked with a second layer of photoresist (PR2) and patterned to form poly 2 word lines. The patterning of the poly 2 stops in the interpoly insulator.

Next, without removing PR2, the interpoly insulator is masked with a third layer of photoresist (PR3). The interpoly insulator and underlying poly 1 are then patterned. During this patterning, PR3 is used to define poly 1 access transistor lines, while the poly 2 word lines and overlying PR2 are used as a self-aligned stacked gate etch mask to define the edges of the poly 1 floating gates that are parallel to the poly 2 word line edges.

Drain, source, and combined drain/source regions are then formed in the silicon substrate. The combined drain/source regions are formed between the poly 1 access transistor lines and the poly 1 floating gates. The combined drain/source regions function as the source of a poly 1 access transistor, as well as the drain of an NVM storage transistor. The drain regions are formed on the sides of the poly 1 access transistor lines that are opposite the combined drain/source regions. The source regions are formed on the sides of the poly 2 word lines opposite the combined drain/source regions. Next, the PR2 and PR3 layers are removed.

In an alternative embodiment of the process, an insulating layer underlying the poly 1 floating gate includes a tunnel insulator portion that is thinner than the remainder of the insulating layer. In addition, a buried region of conductivity type different from that of the silicon substrate is formed in the silicon substrate underneath the tunnel insulator portion. The tunnel insulator portion is located where it will be under the poly 1 floating gate at the completion of the process.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings, of which.

DETAILED DESCRIPTION

Figure 1:
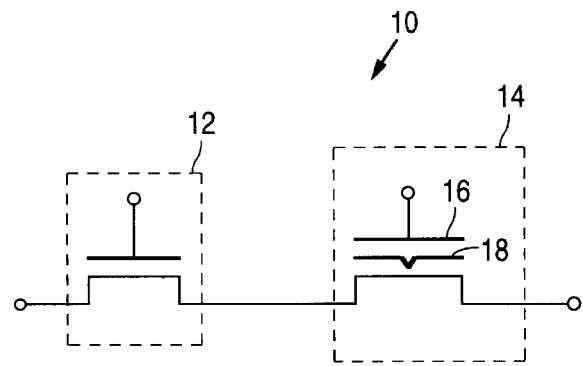
FIG. 1 is an electrical schematic illustration of a conventional two-transistor EEPROM device.
Figure 2:
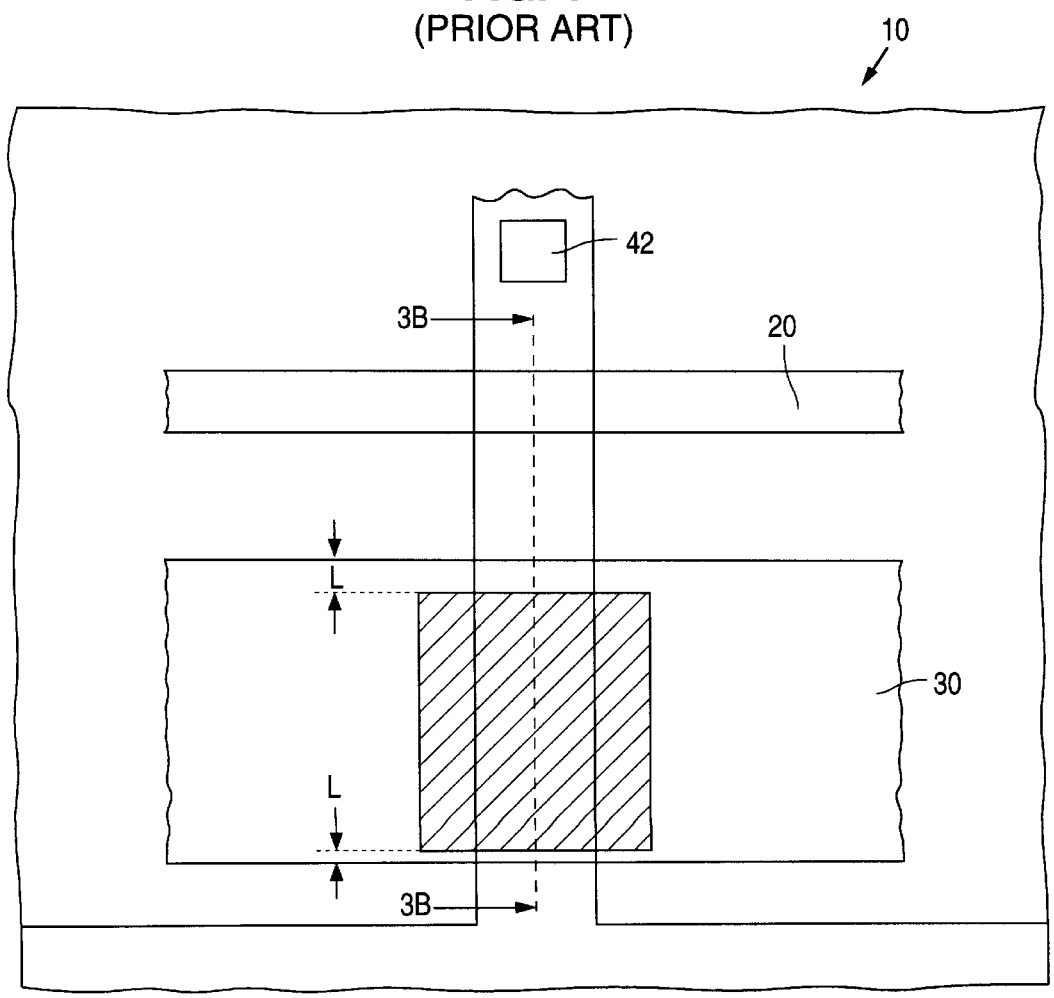
FIG. 2 is a layout of a portion of a conventional two-transistor EEPROM cell. The area where poly 2 overlies poly 1 is shaded in single-crosshatch.

FIGS. 6 and 7A–C illustrate layout and cross-sectional views respectively of a two-transistor EEPROM cell array 60 produced in accordance with the present invention. The cell array 60 includes silicon substrate 62 of a first conductivity type (typically P-type), spaced-apart FOX regions 64, poly 1 access transistor lines 66, poly 1 floating gate 68, interpoly insulator 70, poly 2 word lines 72 and insulating layer 74. Insulating layer 74 includes tunnel portion 76 that is thinner than the remainder of insulating layer 74.

Figure 6:
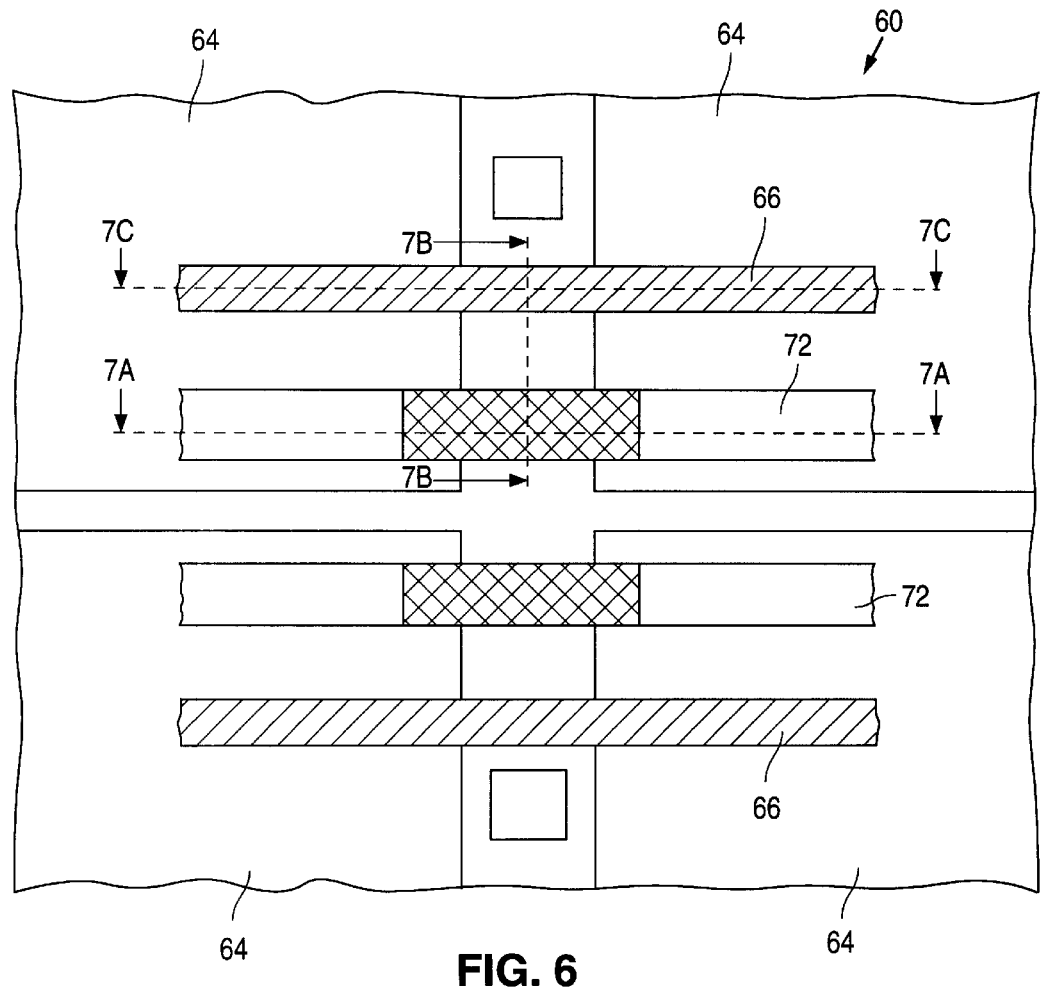
FIG. 6 is a layout of a two-transistor EEPROM cell produced in accordance with the process of the present invention. Poly 1 is shown in single crosshatch, while the area where poly 2 overlies poly 1 is shaded in double crosshatch.
Figure 7A:
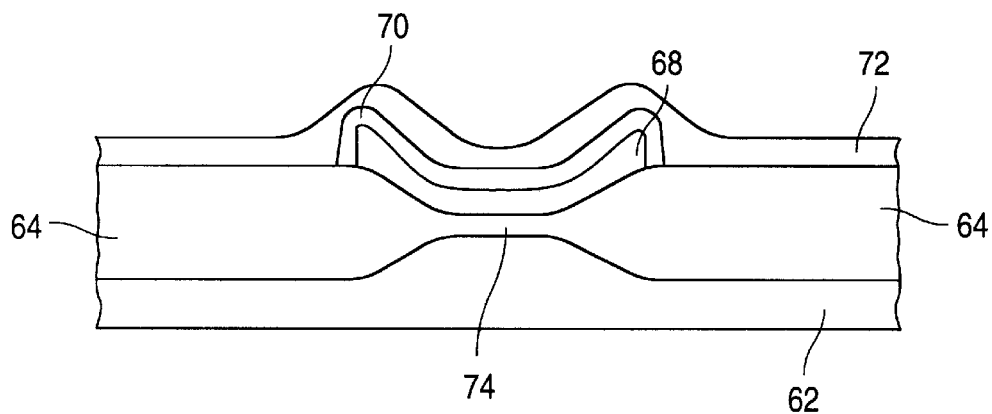
FIGS. 7A–C are cross-sectional views taken along lines 7A—7A, 7B—7B and 7C—7C respectively of FIG. 6.
Figure 7B:
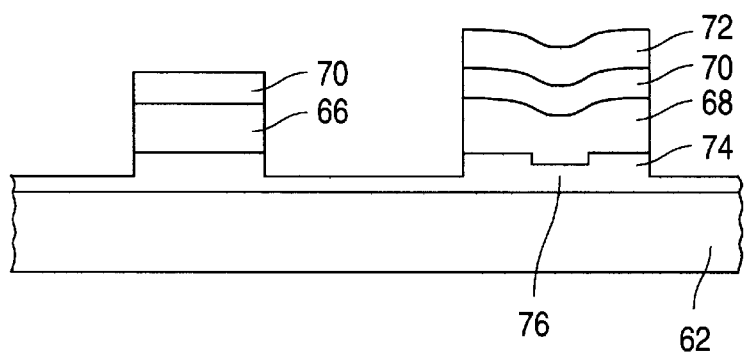
Figure 7C:
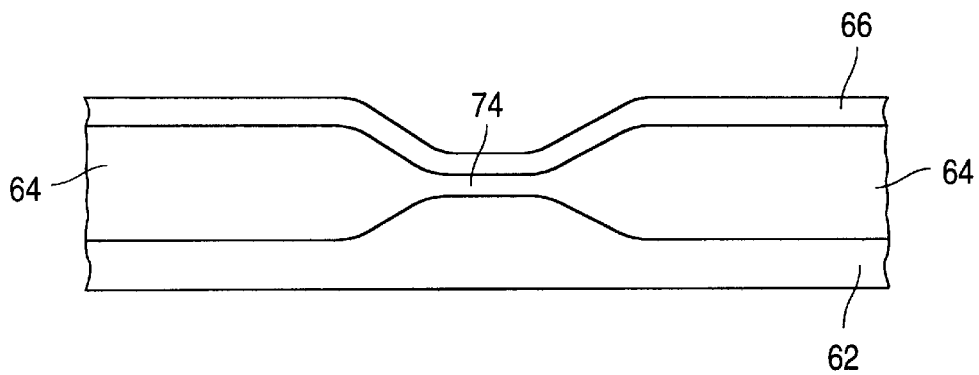

FIGS. 8–23 illustrate a process of fabricating a two-transistor EEPROM cell array, such as that of FIGS. 6–7C, according to the present invention.

Figure 8:
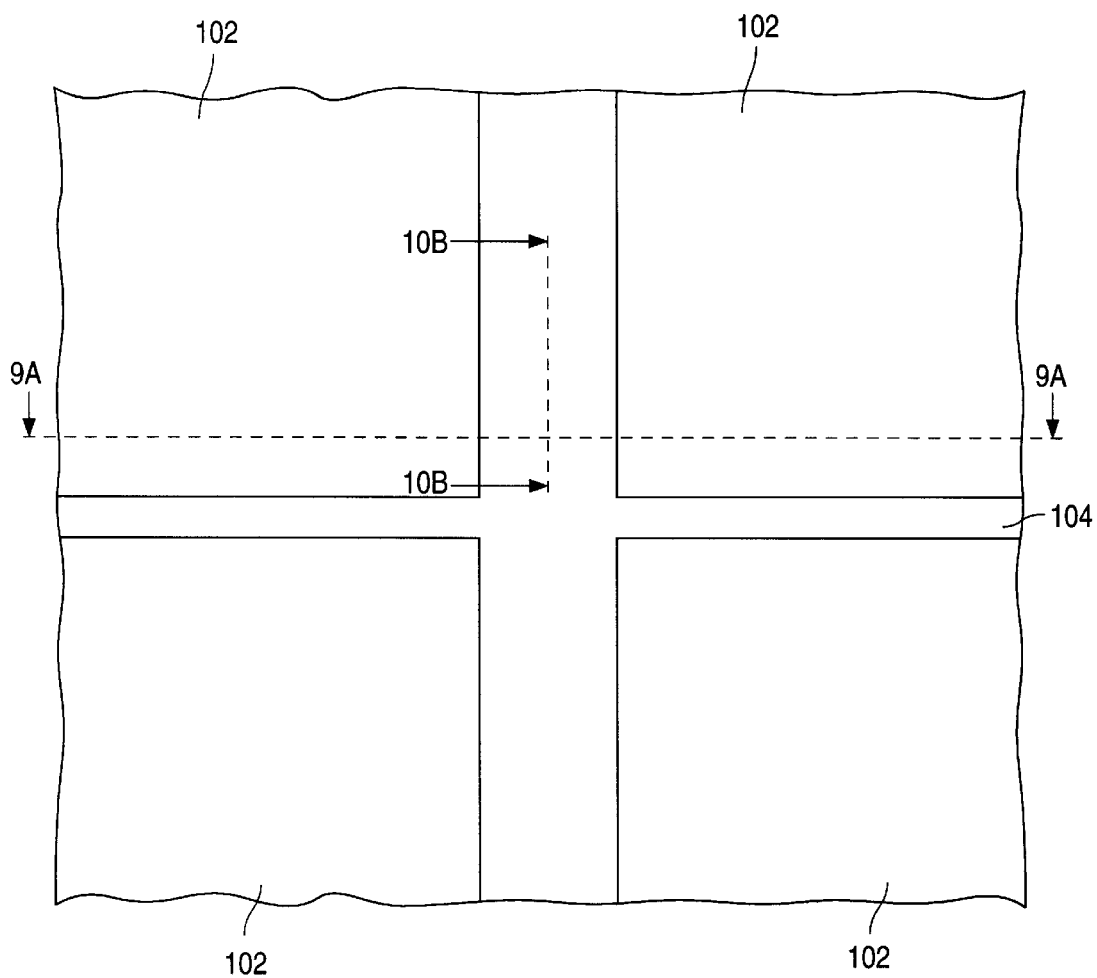
FIG. 8 is a layout during the fabrication of a two-transistor EEPROM cell taken following the step of forming regions of field oxide of a process in accordance with the present invention.
Figure 9:
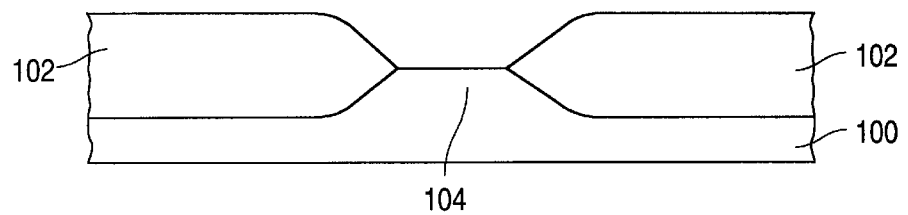
FIG. 9 is cross-section view taken along a line 9A—9A of FIG. 8.

Referring to FIGS. 8 and 9, the process includes first providing a silicon substrate 100 of a first conductivity type, typically P-type. A plurality of spaced-apart field oxide (FOX) regions 102 are then formed in silicon substrate 100. FOX regions 102 can, for example, be formed by conventional thermal processes such as Local Oxidation of Silicon (LOCOS). The thickness of the FOX regions is typically about 5500 angstroms. FOX regions 102 are separated from one another by a cell substrate region 104.

Figure 10:
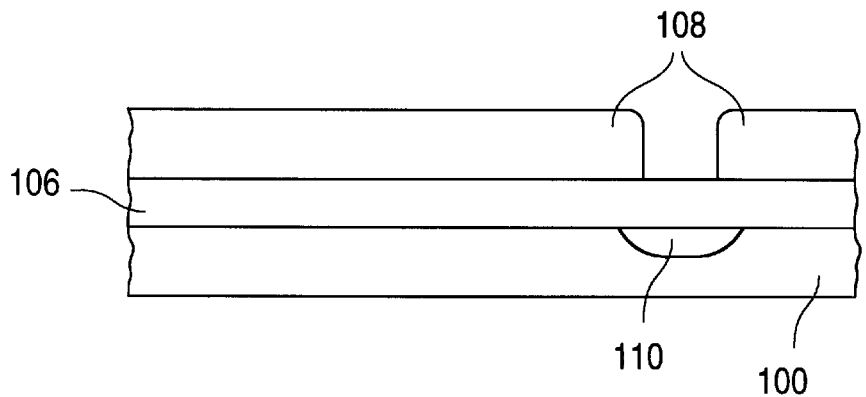
FIG. 10 is a cross-sectional view taken along a line corresponding to 10B—10B of FIG. 8 following the step of masking the insulating layer of a process in accordance with the present invention.

Referring to FIG. 10, next a base insulating material layer 106, such as silicon dioxide of approximately 200 angstroms in thickness, is formed on silicon substrate 100 by conventional thermal oxidation processes. The base insulating material layer 106 is then masked with a patterned photoresist (PR1) layer 108. A buried region 110 of a second conductivity type (typically N-type) is then formed in silicon substrate 100. Formation of the buried region 110 is generally achieved by using ion implantation with PR1 layer 108 serving as an implant mask.

Figure 11:
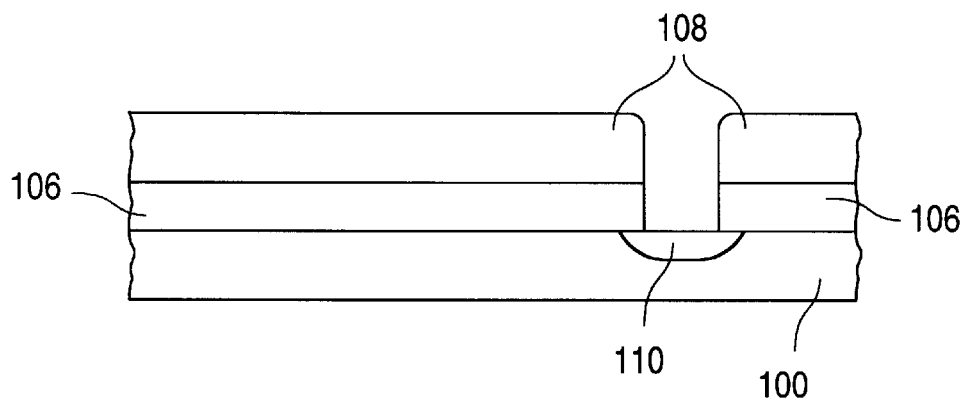
FIG. 11 is a cross-sectional view taken along a line corresponding to 10B—10B of FIG. 8 following the step of forming a buried N+ region in the silicon substrate of a process in accordance with the present invention.

Next, as shown in FIG. 11, a portion of base insulating material layer 106 that overlies the buried region 110 is removed. This removal can be accomplished, for example, by conventional etching techniques using the PR1 layer 108 as an etch mask.

Figure 12:
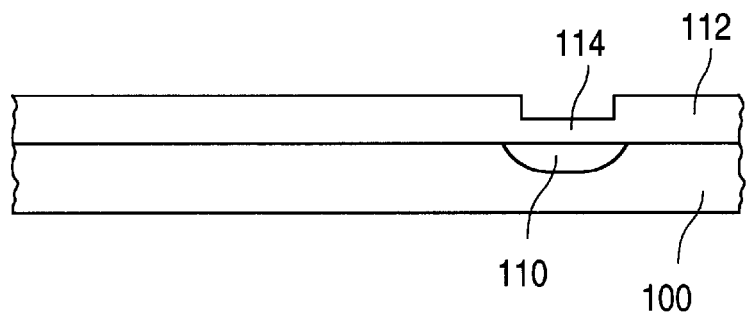
FIG. 12 is a cross-sectional view taken along a line corresponding to 10B—10B of FIG. 8 following the step of forming a tunnel insulator of a process in accordance with the present invention.

Following the removal of a portion of base insulating material layer 106, the PR1 layer 108 is stripped and insulating layer 112, typically silicon dioxide, is formed on silicon substrate 100. As illustrated in FIG. 12, insulating layer 112 is of two thicknesses. A thinner portion of insulating layer 112, typically around 80 angstroms in thickness and known as the tunnel oxide 114, overlies buried region 110 at the very location where a portion of base insulating material layer 106 was previously removed using the PR1 layer 108 as a mask. The remainder of the insulating layer 112 is typically 230 angstroms thick.

The two different thickness of insulating layer 112 can be obtained by conventional thermal oxidation of the silicon substrate surface, after removal of the PR1 layer 108 and without removal of base insulating material layer 106. During such a process, tunnel oxide 114 is grown to a thickness of 80 angstroms on the surface of the silicon substrate where a portion of the base insulating material layer has been removed. At the same time, the remaining base insulating material layer 106, which started at 200 angstroms, is increased in thickness to 230 angstroms to become the insulating layer 112. The final structure is illustrated in FIG. 12.

Figure 13:
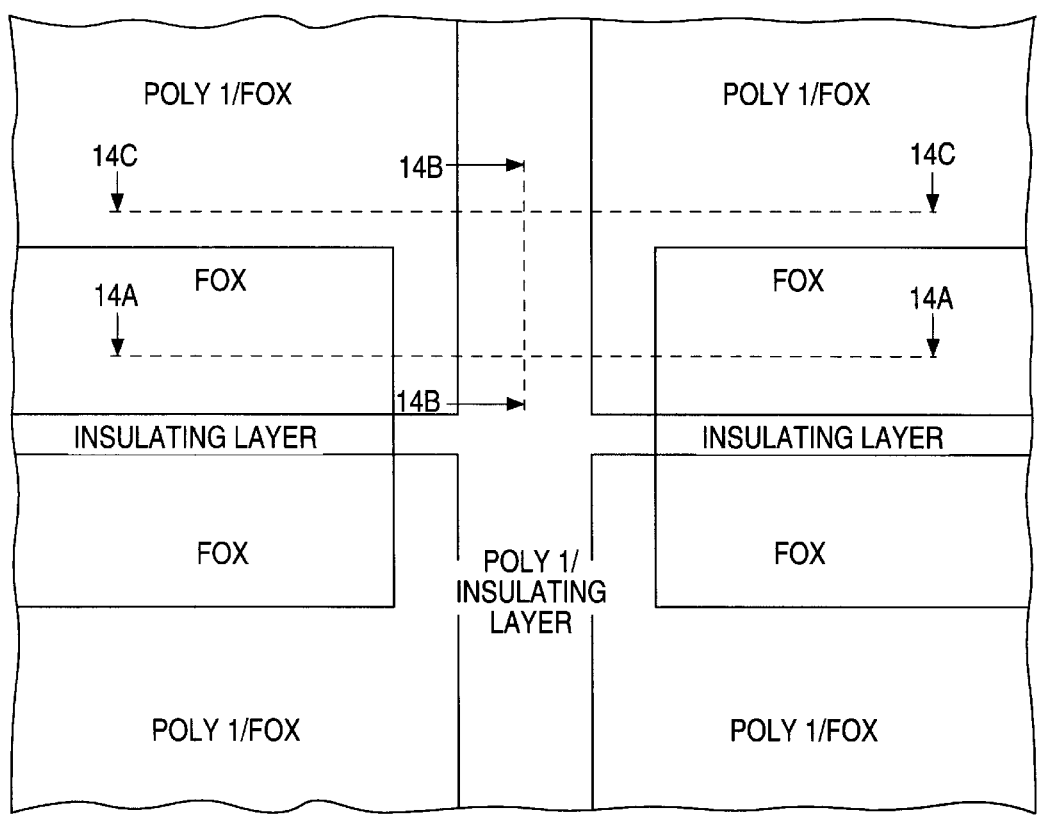
FIG. 13 is a layout during the fabrication of a two-transistor EEPROM cell taken following the steps of forming openings in the poly 1 layer and forming an interpoly insulator layer of a process in accordance with the present invention.

Next, a layer of first polysilicon (poly 1) 116, approximately 2000 angstroms thick, is deposited over insulating layer 112 and doped in a conventional manner, such as by ion implantation or POCl$_3$ processing. Poly 1 116 is then masked and patterned to provide openings in the poly 1 exposing portions of the FOX regions 102 and insulating layer 112, as illustrated in the layout of FIG. 13. The openings also define poly 1 edges, portions of which are the precursors to poly 1 floating gate edges. These poly 1 floating gate edges will be perpendicular to poly 2 word line edges at the completion of the process.

Figure 14A:
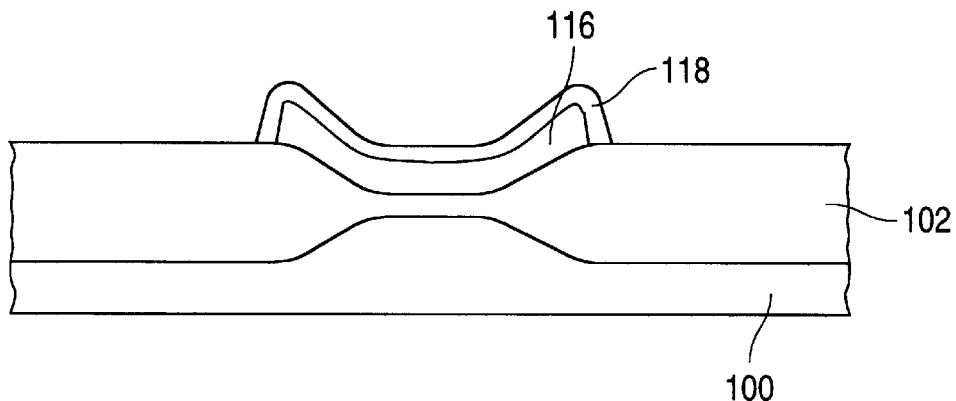
FIG. 14 A–C are cross-sectional views taken along lines 14A—14A, 14B—14B and 14C—14C respectively of FIG. 13.
Figure 14B:
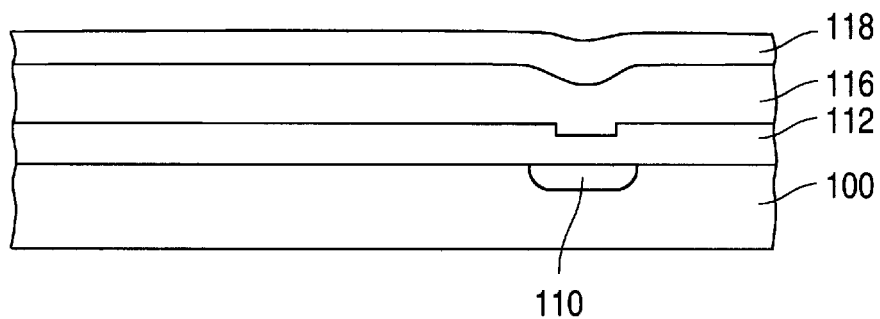
Figure 14C:
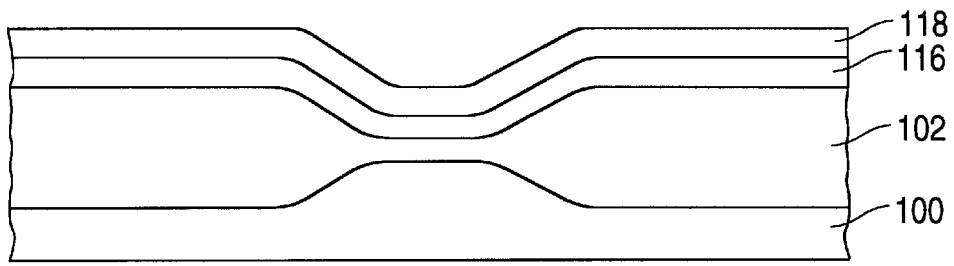

A second layer of insulating material is then formed overlying poly 1 116, the exposed portions of the FOX regions 102 and the exposed portions of insulating layer 112. This second layer of insulating material is known as the interpoly insulator 118 and is typically silicon dioxide or an oxide-nitride-oxide (ONO) layered composite material (approximately 180 angstrom oxide equivalent in thickness). FIGS. 14A–C illustrate the resultant structures.

Figure 15:
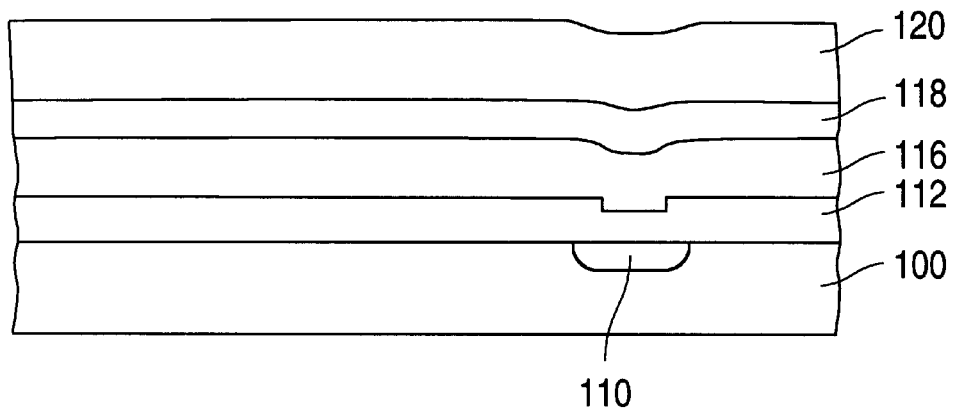
FIG. 15 is a cross-sectional view taken along a line corresponding to 14B—14B of FIG. 13 following the step of forming a layer of second polysilicon of a process in accordance with the present invention.
Figure 16:
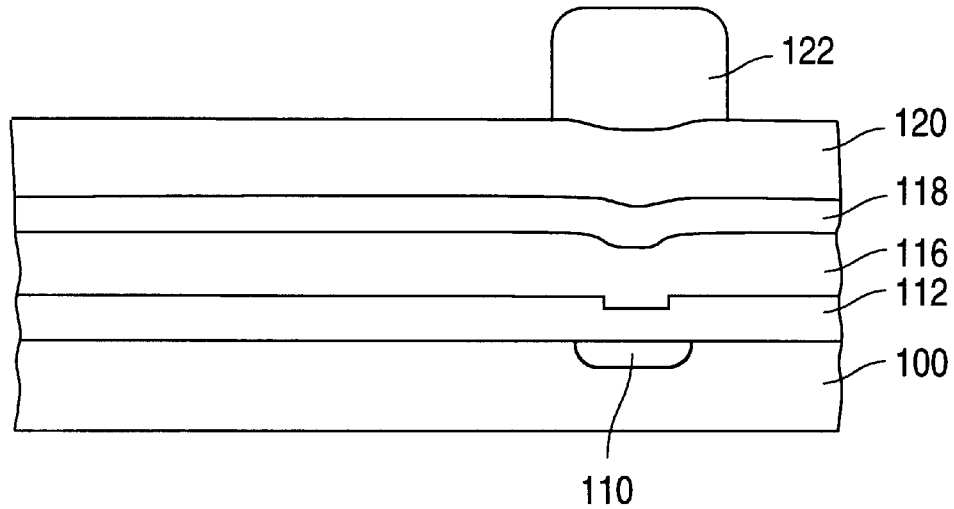
FIG. 16 is a cross sectional view taken along a line corresponding to B—B of FIG. 13 following the step of masking the poly 2 layer of a process in accordance with the present invention.
Figure 17:
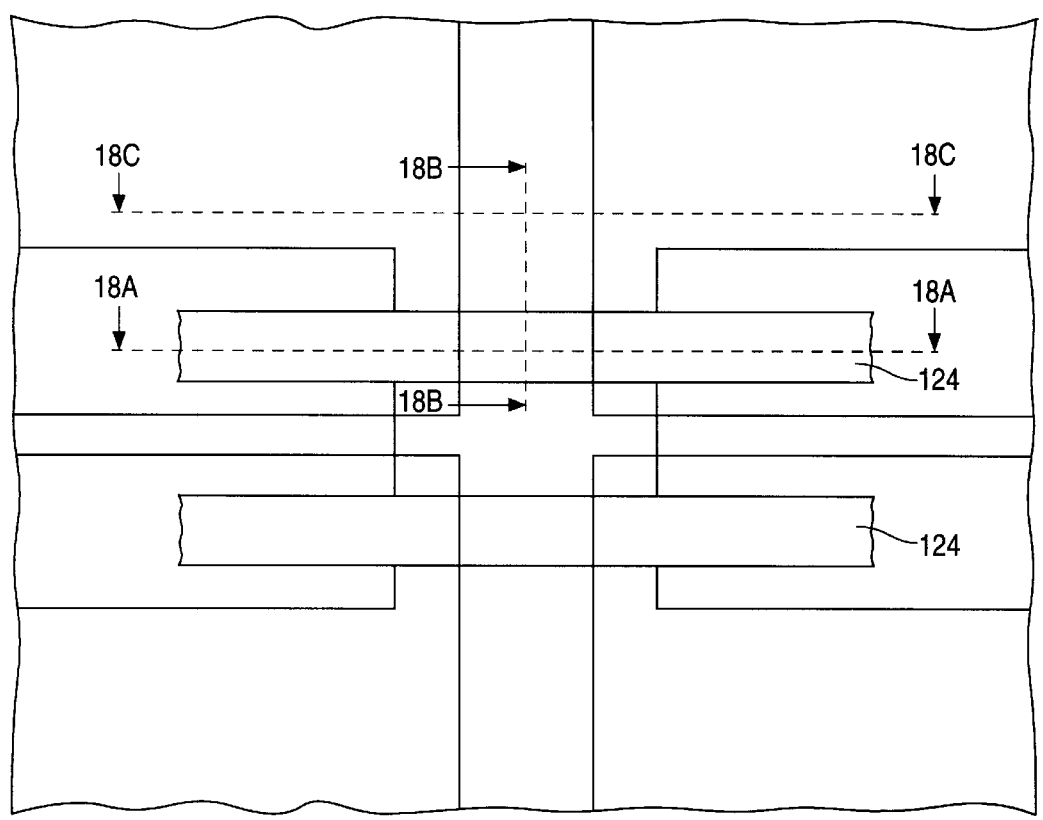
FIG. 17 is a layout during the fabrication of a two-transistor EEPROM cell taken following the step of defining poly 2 word lines of a process in accordance with the present invention.
Figure 18A:
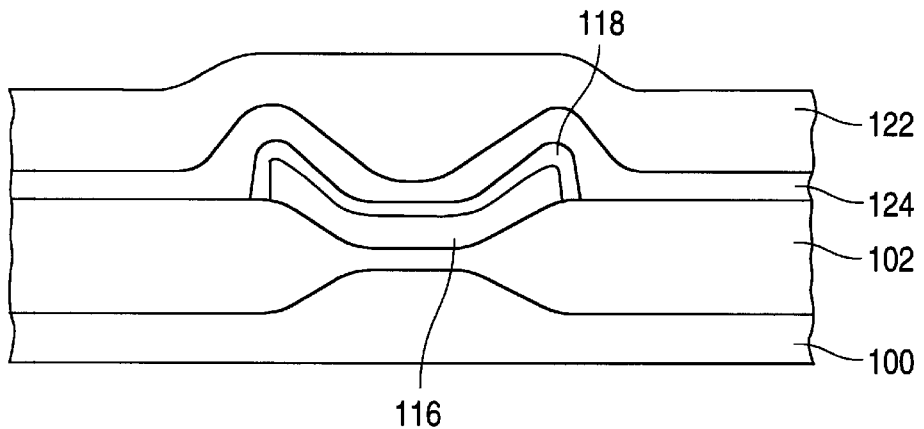
FIGS. 18A–C are cross-sectional views taken along lines 18A—18A, 18B—18B and 18C—18C respectively of FIG. 17.
Figure 18B:
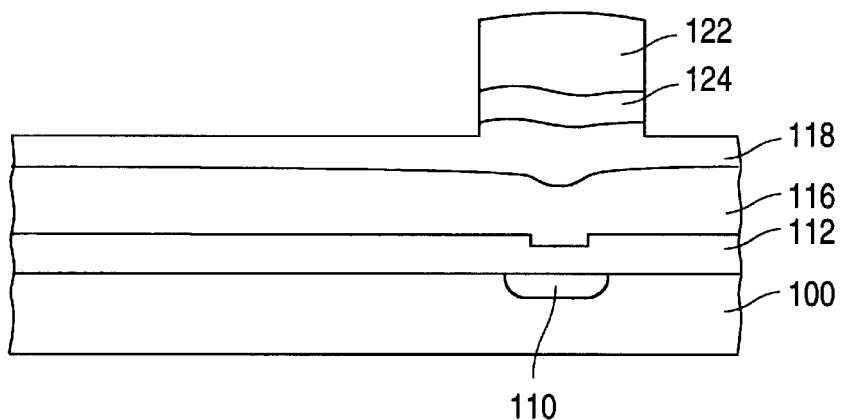
Figure 18C:
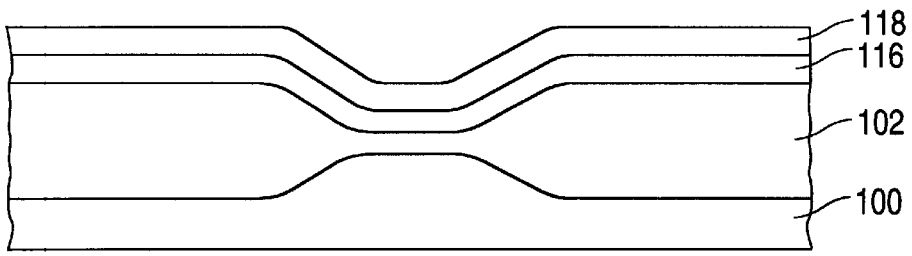

Referring to FIG. 15, subsequent to the formation of the interpoly insulator 118, a layer of second polysilicon (poly 2) 120, typically 2000 angstroms thick, is deposited on interpoly insulator 118. Referring to FIG. 16, poly 2 120 is then masked with a second layer of patterned photoresist (PR2) 122.

Poly 2 120 is then patterned (stopping on or in interpoly insulator 118), to produce a plurality of poly 2 word lines 124. The resultant structures are illustrated in FIGS. 17 and 18A–C.

Figure 19:
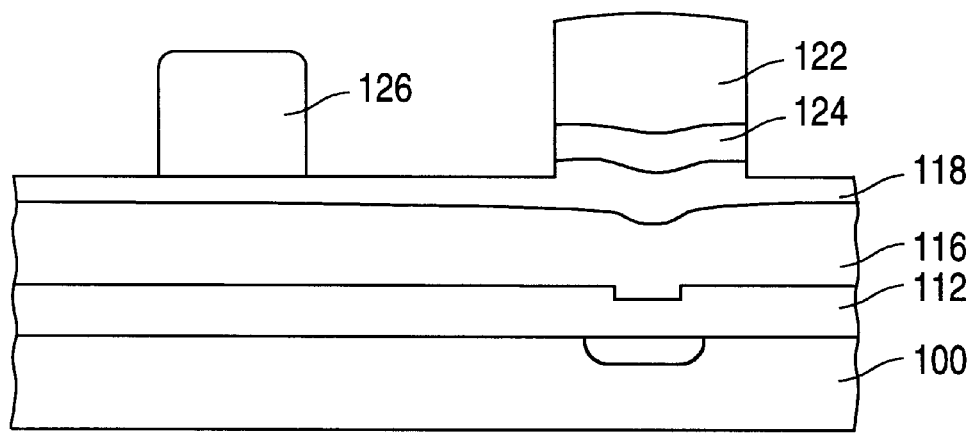
FIG. 19 is a cross-sectional view taken along a line corresponding to 18B—18B of FIG. 17 following the step of masking the interpoly insulator layer with PR3 of a process in accordance with the present invention.

Next, without removing PR2 122, a third layer of photoresist (PR3) 126 is applied over a portion of the interpoly insulator 118 and patterned as illustrated in FIG. 19.

Figure 20:
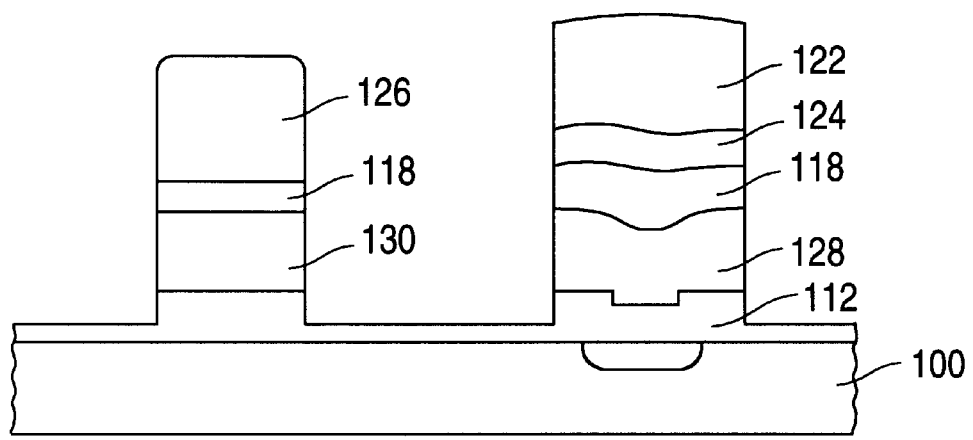
FIG. 20 is a cross-sectional view taken along a line corresponding to 18B—18B of FIG. 17 following the step of defining poly 1 access transistor lines and poly 1 floating gates of a process in accordance with the present invention.

Referring to FIG. 20, interpoly insulator 118 and poly 1 116 are then etched, utilizing poly 2 word lines 124 as a self-aligned mask to define the edges of a poly 1 floating gate 128 that are parallel to the poly 2 word line. A further description of self-aligned stacked gate etches is found in U.S. Pat. Nos. 5,240,870 and 5,371,030 to Bergemont. Simultaneously with the self-aligned stacked gate etch of poly 1, patterned PR3 layer 126 is used as an etch mask to define poly 1 access transistor line 130.

It should be noted that the edges of the poly 1 floating gate that are perpendicular to the poly 2 word line were previously defined when openings were formed in poly 1.

Figure 5:
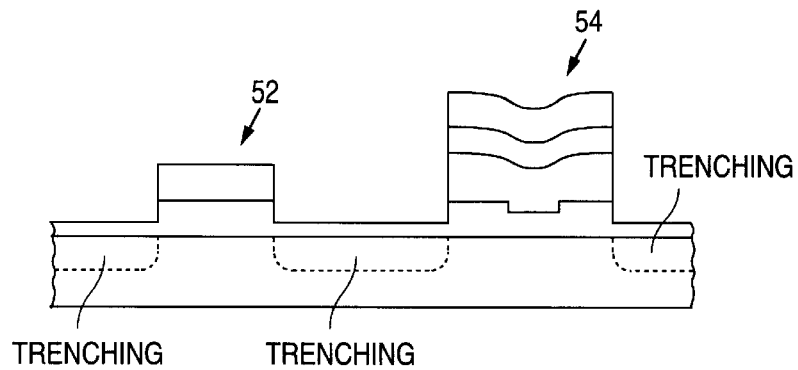
FIG. 5 is a cross-sectional view illustrating the regions of the two-transistor EEPROM cell of FIG. 4 that are susceptible to trenching during conventional self-aligned stacked gate etch processes.

Any risk of trenching into the silicon substrate 100, as illustrated in FIG. 5 in relation to conventional processes, is eliminated since the interpoly insulator 118, poly 1 116 and insulating layer 112 are covering the relevant regions of cell substrate region 104 during the self-aligned stacked gate etch process of the present invention. This is distinguished over conventional processes in which there are regions of the silicon substrate that are either completely exposed to etching or protected by an inadequately thin layer of silicon dioxide. In addition, in conventional processes, the protecting layer of silicon dioxide can only be made thicker at the expense of increasing the number and complexity of process steps.

Figure 21:
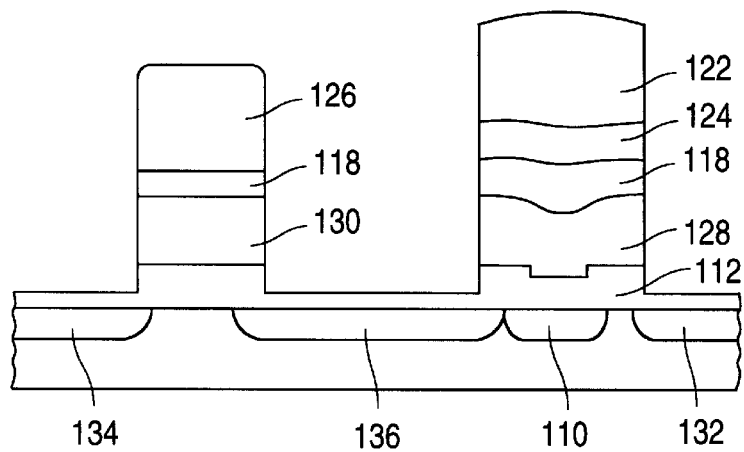
FIG. 21 is a cross-sectional view taken along a line corresponding to 18B—18B of FIG. 17 following the step of defining source, drain and combined source/drain regions of a process in accordance with the present invention.

As shown in FIG. 21, following the self-aligned stacked gate etch step, drain region 132, source region 134 and combined drain/source region 136 are then formed in cell substrate region 104. These regions are of a different conductivity type from silicon substrate 100. Conventional N-type implant processes can be used to form these regions when the silicon substrate is P-type.

Figure 22:
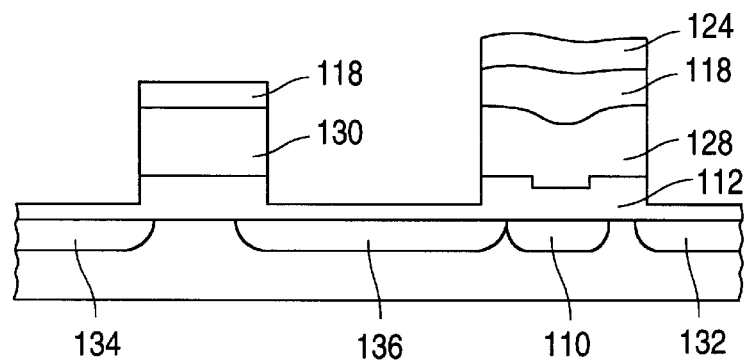
FIG. 22 is a cross-sectional view taken along a line corresponding to 18B—18B of FIG. 17 following the step of removing PR2 and PR3 of a process in accordance with the present invention.

Finally, PR2 layer 122 and PR3 layer 126 are stripped. The resulting structure is shown in FIG. 22 and is equivalent to that of FIG. 7B.

Figure 3:
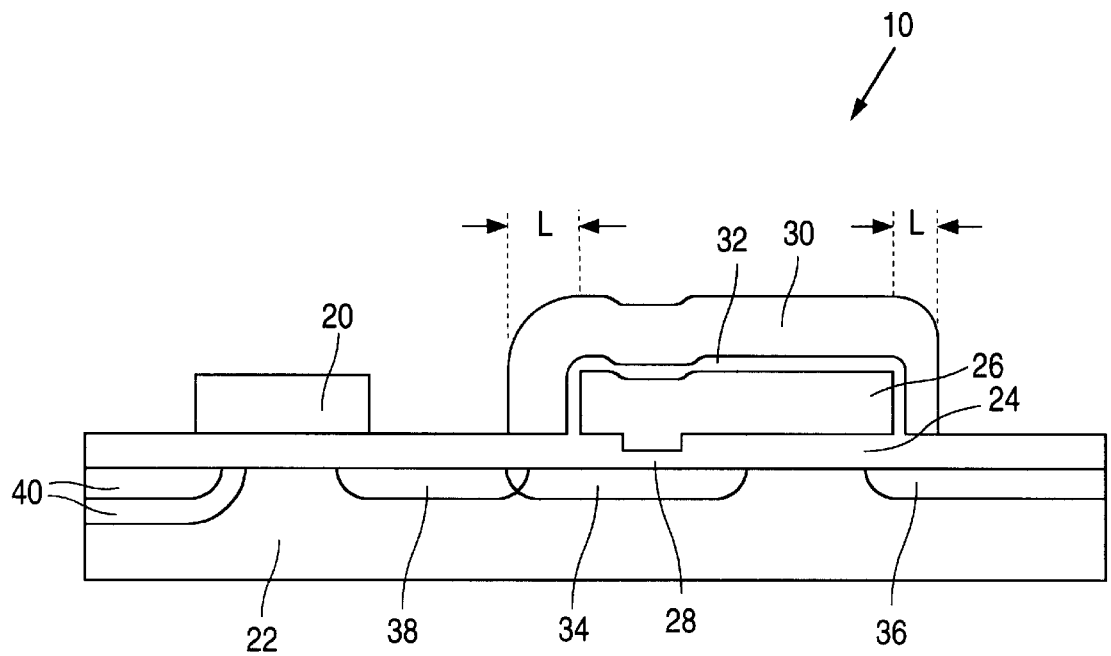
FIG. 3 is a cross-sectional view taken along line 3B—3B of FIG. 2.
Figure 4:
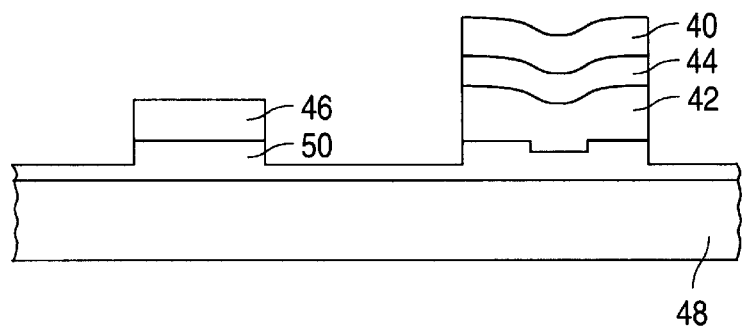
FIG. 4 is a cross-sectional view of a two-transistor EEPROM cell wherein the poly 1 floating gate is self-aligned to the poly 2 word line.
Figure 23:
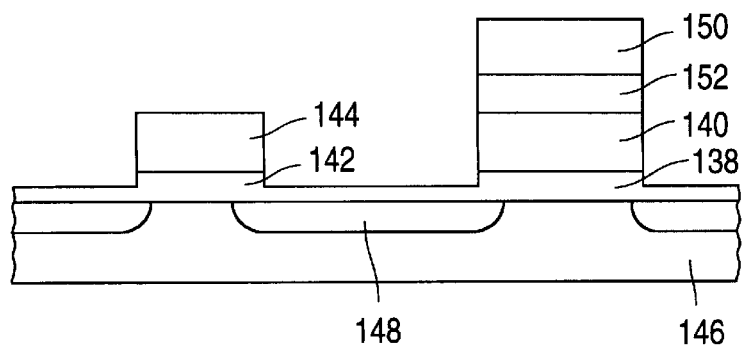
FIG. 23 is a cross-sectional view taken along a line corresponding to B—B of FIG. 17 following the step of removing PR2 and PR3 of an alternative embodiment of a process in accordance with the present invention.

Provided with the ability to make a two-transistor EEPROM cell by the process disclosed above, the structure illustrated in FIGS. 7A–7C can be altered while still providing a workable two-transistor EEPROM cell. As illustrated in FIG. 23, in another embodiment of the present invention, an insulating layer 138 underlying poly 1 floating gate 140 has uniform thickness (equal to the tunnel oxide 114 of FIGS. 12, 14–16 and 18–22) and an insulating layer 142 of identical thickness insulates poly 1 access transistor gate 144 from silicon substrate 146. In the embodiment of FIG. 23, there is no need for a region equivalent to buried region 110 of FIG. 10–22, since poly 1 floating gate 140 can be erased and programmed directly from N+ region 148. This simplification is made possible by the self-aligned nature of poly 2 word line 150 and poly 1 floating gate 140, whereby lateral spread of N+ region 148 is sufficient to extend underneath of poly 1 floating gate 140 (as opposed to the conventional structure of FIG. 3 wherein the N+ region 38 does not extend underneath of floating gate 26 due to the overhang of the word line control gate 30). In FIG. 23, element 152 represents an interpoly insulator.

A process of fabricating the structure illustrated in FIG. 23 includes forming an insulating layer (typically silicon dioxide of approximately 80 angstroms in thickness) on a silicon substrate. Then a layer of first polysilicon (poly 1), approximately 2000 angstroms thick, is deposited on the insulating layer. The remainder of the process is identical to that of the aforementioned embodiment commencing with the formation of interpoly insulator 118.

The oxidation step used to form the insulating layer can be identical to the process used to form insulating layer 112 of FIG. 12 in the process detailed above. However, since base insulating material layer 106 is not present in this particular embodiment of the invention, an insulating layer of uniform thickness is obtained, Therefore, the process of forming the two-transistor EEPROM structure of FIG. 23 can be identical to that described above with reference to FIGS. 8–22, except that the steps involving the formation of base insulating material layer 106, PR1 layer 108, buried region 110 and dual thickness insulating layer 112 are replaced with the single step of forming insulating layer 138. The result is a simplified process which still provides the benefits of a poly 1 floating gate that is self-aligned to a poly 2 word line, as well as the elimination of trenching. However, cell operating voltages must be designed to accommodate an access transistor that is insulated from the silicon substrate by only thin insulating layer 142 (see FIG. 23), rather than relatively thick insulating layer 112 (see FIG. 22).

It should be understood that various alternatives to the embodiments of the invention described herein may be employed in practicing the invention. It is intended that the following claims define the scope of the invention and that methods within the scope of these claims and their equivalents by covered thereby.

What is claimed is:

1. A method of fabricating a two-transistor EEPROM cell, the method comprising the steps of:

providing a silicon substrate of a first conductivity type;

forming a plurality of spaced-apart field oxide (FOX) regions in the silicon substrate, the FOX regions being separated by cell substrate regions;

forming an insulating layer on the cell substrate regions;

forming a layer of first polysilicon (poly 1) oveylying the insulating layer;

masking and patterning poly 1 to define openings in the poly 1 exposing portions of the FOX regions and exposing portions of the insulating layer;

forming a layer of interpoly insulator overlying the poly 1, exposed portions of the FOX regions and exposed portions of the insulating layer;

forming a plurality of second polysilicon (poly 2) word lines overlying the interpoly insulator;

masking the interpoly insulator with a layer of patterned photoresist;

performing a self-aligned stacked gate etch wherein the poly 2 word lines are utilized as a self-aligned mask to pattern the poly 1, thereby defining poly 1 floating gates of a two-transistor EEPROM cell, and wherein the layer of patterned photoresist is utilized as a mask to pattern the poly 1 to define poly 1 access transistor lines of a two-transistor EEPROM cell;

forming simultaneously, combined drain/source regions of a second conductivity type in the silicon substrate between the poly 1 access transistor lines and the poly 1 floating gates, source regions of the second conductivity type in the silicon substrate adjacent to the poly 1 access transistor lines and drain regions of a second conductivity type adjacent to the poly 1 floating gates; and stripping the layer of patterned photoresist.

2. The method of claim 1 wherein the step of providing a silicon substrate of a first conductivity type includes providing a substrate of P-type conductivity.

3. The method of claim 1 wherein the step of forming an insulating layer on the silicon substrate includes forming a silicon dioxide insulating layer on the silicon substrate.

4. The method of claim 1 wherein the step of forming a layer of insulating layer includes forming a layer of silicon dioxide insulating layer.

5. The method of claim 1 wherein the step of forming a layer of interpoly insulator includes forming a layer of oxide-nitride-oxide interpoly insulator.

6. The method of claim 1 wherein the step of forming an insulating layer includes forming an insulating layer that includes a gate insulator portion of a first thickness and a tunnel insulator portion of a second thickness, wherein the second thickness is less than the first thickness.

* * * * *